(12) United States Patent
Wang et al.

(10) Patent No.: US 10,476,042 B2
(45) Date of Patent: Nov. 12, 2019

(54) DISPLAY-SUBSTRATE MOTHERBOARD, DISPLAY SUBSTRATE, METHOD FOR MANUFACTURING THE SAME AND DISPLAY APPARATUS

(71) Applicant: BOE TECHNOLOGY GROUP CO., LTD., Beijing (CN)

(72) Inventors: Tao Wang, Beijing (CN); Tao Sun, Beijing (CN); Song Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/002,188

(22) Filed: Jun. 7, 2018

(65) Prior Publication Data

US 2019/0157626 A1    May 23, 2019

(30) Foreign Application Priority Data

Nov. 17, 2017   (CN) .......................... 2017 1 1146620

(51) Int. Cl.
*H01L 51/52*   (2006.01)
*H01L 51/00*   (2006.01)
*H01L 51/56*   (2006.01)

(52) U.S. Cl.
CPC .......... *H01L 51/56* (2013.01); *H01L 51/0097* (2013.01); *H01L 51/5253* (2013.01); *H01L 2251/5338* (2013.01); *H01L 2251/566* (2013.01)

(58) Field of Classification Search
CPC ...................... H01L 51/5253; H01L 2251/566
USPC ............................................................ 257/40
See application file for complete search history.

(56) References Cited

U.S. PATENT DOCUMENTS

| | | | |
|---|---|---|---|
| 2008/0220151 A1* | 9/2008 | Kataoka | H01L 51/56 427/66 |
| 2012/0267646 A1* | 10/2012 | Kim | H01L 51/5253 257/88 |
| 2013/0305981 A1* | 11/2013 | Kamei | C30B 19/06 117/13 |
| 2015/0036299 A1* | 2/2015 | Namkung | G02F 1/133345 361/749 |
| 2015/0048329 A1* | 2/2015 | Kim | H01L 51/5253 257/40 |
| 2017/0326682 A1* | 11/2017 | Park | B23K 26/0619 |

* cited by examiner

*Primary Examiner* — David Vu
*Assistant Examiner* — Brandon C Fox
(74) *Attorney, Agent, or Firm* — Brooks Kushman P.C.

(57) ABSTRACT

The present disclosure provides a display-substrate motherboard, a display substrate, a method for manufacturing the same and a display apparatus. The display-substrate motherboard includes a base substrate, an inorganic layer on the base substrate, a plurality of spaced display components on the inorganic layer, and a protection pattern on the inorganic layer. The protection pattern covers a laser cutting area between the plurality of spaced display components.

7 Claims, 3 Drawing Sheets

DISPLAY-SUBSTRATE MOTHERBOARD, DISPLAY SUBSTRATE, METHOD FOR MANUFACTURING THE SAME AND DISPLAY APPARATUS

CROSS-REFERENCE TO RELATED APPLICATION

This application claims priority to Chinese Patent Application No. 201711146620.6, filed on Nov. 17, 2017, which is incorporated herein by reference in its entirety.

TECHNICAL FIELD

The present disclosure relates to the field of display technology, and in particular to a display-substrate motherboard, a display substrate, a method for manufacturing the same and a display apparatus.

BACKGROUND

Currently, bendable display may be realized by means of a liquid crystal display (LCD) or an organic light emitting diode (OLED) display. Due to the self-luminous characteristics, the OLED display prepared on a flexible substrate can more easily realize bendable display with smaller bending radius. Thus, fabrication of the OLED display based on the flexible substrate has attracted widespread attention.

A flexible display substrate mother board is usually cut off by laser to form flexible display substrates. Since the laser cutting may result in local overheating phenomenon, cracks may occur in an edge of an inorganic layer of the flexible display substrate due to instantaneous thermal expansion and contraction. Outside water vapor may penetrate in along the cracks, thereby resulting failure of the flexible display component.

SUMMARY

One embodiment of the present disclosure provides a display-substrate motherboard which includes a base substrate, an inorganic layer on the base substrate, a plurality of spaced display components on the inorganic layer and a protection pattern on the inorganic layer. The protection pattern covers a laser cutting area between the plurality of spaced display components.

Further, the display-substrate motherboard further includes a laser cutting line in the laser cutting area; wherein an orthographic projection of the laser cutting line to the inorganic layer is within an orthographic projection of the protection pattern to the inorganic layer.

Further, a line width of the protection pattern in a direction perpendicular to an extension direction of the protection pattern is 1.1 to 3 times a line width of the laser cutting line in a direction perpendicular to an extension direction of the laser cutting line.

Further, the protection pattern is made of laser melting materials or laser hot-melt materials.

One embodiment of the present disclosure provides a method for manufacturing the above display-substrate motherboard, including: providing a base substrate; forming an inorganic layer on the base substrate; forming a plurality of spaced display components on the inorganic layer; and forming a protection pattern on the inorganic layer with the protection pattern covering a laser cutting area between adjacent display components.

Further, the forming a protection pattern on the inorganic layer with the protection pattern covering a laser cutting area between adjacent display components includes: forming the protection pattern on the inorganic layer by means of screen printing or coating.

Further, the protection pattern is made of laser melting materials or laser hot-melt materials.

One embodiment of the present disclosure provides a display substrate including: a flexible base substrate, an inorganic layer on the flexible base substrate, a display component on the inorganic layer, a first protection portion and a second protection portion. The first protection portion covers a top surface of the inorganic layer, surrounds the display component and is spaced from the display component. The second protection portion covers a lateral side of the inorganic layer and a lateral side of the flexible base substrate along a periphery of the flexible display substrate.

Further, the first protection portion and the second protection portion are made of low-temperature glass powder materials.

Further, the first protection portion and the second protection portion are made of polyethylene or polystyrene polycarbonate.

Further, the display substrate further includes: a package film layer covering the display component; wherein the package film layer is spaced from the first protection portion.

One embodiment of the present disclosure provides a method for manufacturing a display substrate including: providing a base substrate; forming an inorganic layer on the base substrate; forming a plurality of spaced display components on the inorganic layer; forming a protection pattern on the inorganic layer with the protection pattern covering a laser cutting area between adjacent display components; and using laser to cut the protection pattern along a laser cutting line to form a plurality of display substrates.

Further, the forming a protection pattern on the inorganic layer with the protection pattern covering a laser cutting area between adjacent display components includes: forming the protection pattern on the inorganic layer by means of screen printing or coating.

One embodiment of the present disclosure provides a display apparatus including the above display substrate.

BRIEF DESCRIPTION OF THE DRAWINGS

The accompanying drawings, which are incorporated in and constitute a part of this specification, illustrate embodiments consistent with the present disclosure and, together with the description, serve to explain the principles of the present disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise indicated. The implementations set forth in the following description of exemplary embodiments do not represent all implementations consistent with the disclosure. Instead, they are merely examples of devices and methods consistent with aspects related to the disclosure as recited in the appended claims.

Figure 1:
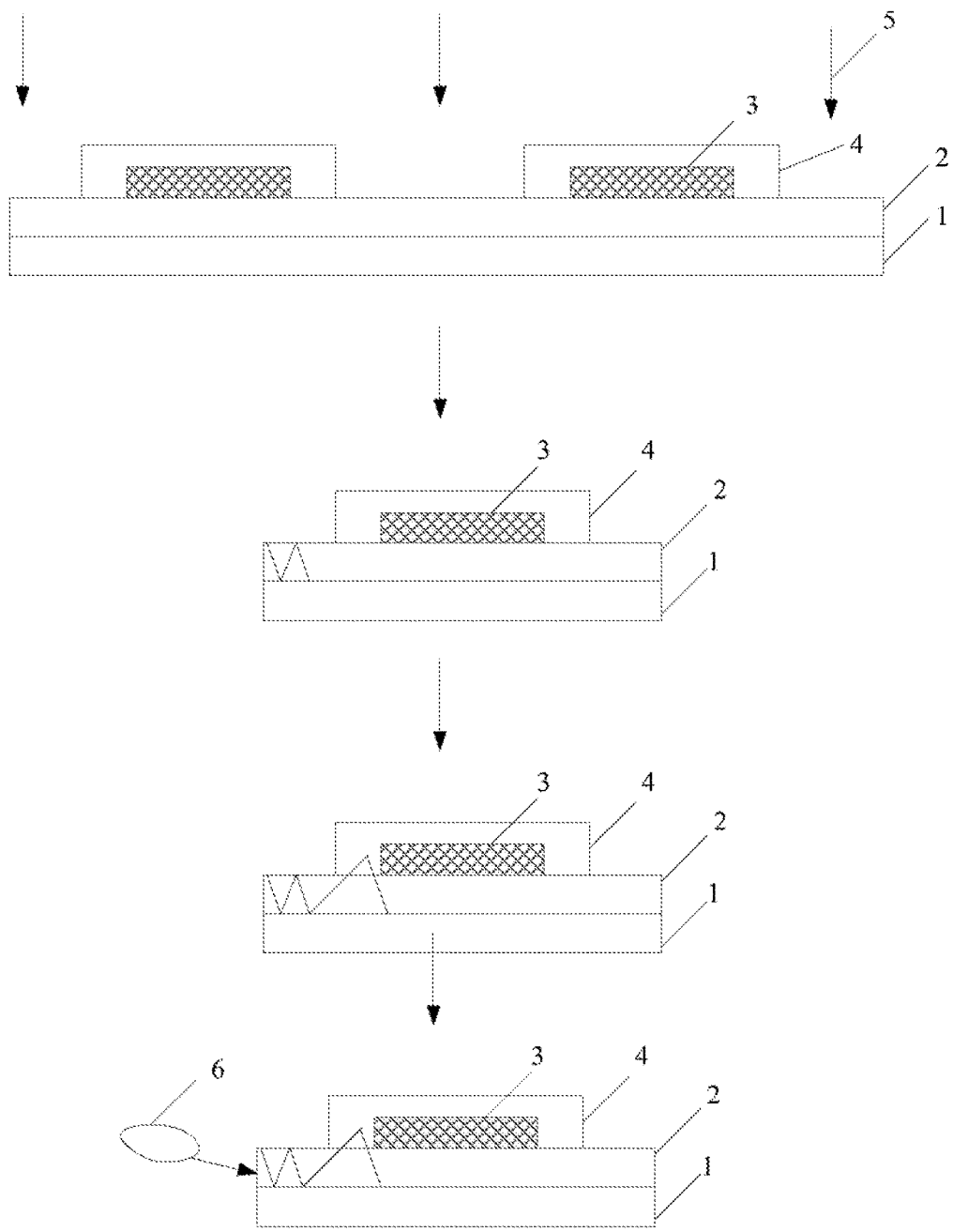
FIG. 1 is a schematic diagram showing a process of manufacturing a display substrate in the related art.

One flexible display-substrate motherboard is usually cut by laser. As shown in FIG. 1, a flexible display-substrate motherboard in the related art includes a flexible base substrate 1, an inorganic layer 2 on the flexible base substrate 1, and a plurality of display components 3 on the inorganic layer 2. The display components 3 are spaced from each other with a laser cutting area defined between adjacent display components. A single display substrate is formed by using laser to cut the display substrate mother board. Since the laser cutting may result in local overheating phenomenon, as shown in FIG. 1, cracks may occur in an edge of the inorganic layer 2 due to instantaneous thermal expansion and contraction. The cracks may spread inwardly, and then outside water vapor 6 may penetrate in along the cracks, thereby resulting failure of the display substrate.

In order to solve the above problem, embodiments of the present disclosure provide a display-substrate motherboard, a display substrate, a method for manufacturing the same and a display apparatus, which can prevent occurrence of cracks in an edge of an inorganic layer of the display substrate, thereby preventing outside water vapor from penetrating in along the cracks and then ensuring that the display substrate will not fail.

One display-substrate motherboard provided in one embodiment of the present disclosure, and includes a base substrate, an inorganic layer on the base substrate, and a plurality of display components on the inorganic layer. The display components are spaced from each other with a laser cutting area defined between adjacent display components. The display-substrate motherboard further includes a protection pattern on the inorganic layer. The protection pattern covers the laser cutting area.

In this embodiment, the protection pattern is provided on the inorganic layer of the display-substrate motherboard and covers the laser cutting area, thus, when the display-substrate motherboard is cut off by the laser to form display substrates, the protection pattern can protect the inorganic layer at the laser cutting area, thereby reducing or eliminating cracks caused by the laser cutting to the inorganic layer and then preventing outside water vapor from penetrating in along the cracks. Further, under action of heat generated by the laser, the protection pattern along a laser cutting line can be melted to cover a lateral side of the inorganic layer, thereby further enhancing the encapsulation effect, preventing outside water vapor from penetrating in, ensuring that the display substrate will not fail and improving reliability and yield of the display substrate.

The above display-substrate motherboard may be a flexible display-substrate motherboard or a rigid display-substrate motherboard. When the display-substrate motherboard is one flexible display-substrate motherboard, the base substrate may be a flexible base substrate, such as a polyimide film. When the display-substrate motherboard is one rigid display-substrate motherboard, the base substrate may be a rigid base substrate, such as a quartz substrate or a glass substrate.

The above inorganic layer may include a barrier layer, a buffer layer, a gate insulation layer and an interlayer insulation layer that are on the flexible base substrate. Alternatively, the above inorganic layer may also include one or more inorganic layers of a film encapsulation layer. The above inorganic layer may be made of silicon oxide, silicon nitride, or silicon oxynitride. The above inorganic layer has a thickness in a range of from 1000 angstroms to 20000 angstroms.

In the display-substrate motherboard, the laser cutting area may be disposed around each display component in one or more circles, then the protection pattern may also be disposed around each display component in one or more circles, as long as the protection pattern can cover the laser cutting area. The protection pattern may completely cover the laser cutting area, or cover portions of the laser cutting area, as long as the protection pattern covers the laser cutting line in the laser cutting area.

The laser cutting line is formed in the laser cutting area. When cutting the display-substrate motherboard, the display-substrate motherboard is cut off along the laser cutting line. In order to enable the protection pattern to effectively protect the inorganic layer, an orthographic projection of the laser cutting line to the inorganic layer is within an orthographic projection of the protection pattern to the inorganic layer, i.e., the protection layer covers the entire of the laser cutting line in the laser cutting area.

In order to enable the protection pattern to effectively protect the inorganic layer, the size of the protection pattern is slightly greater than the size of the laser cutting line. Specifically, a line width of the protection pattern in a direction perpendicular to an extension direction of the protection pattern may be 1.1 to 3 times a line width of the laser cutting line in a direction perpendicular to an extension direction of the laser cutting line. For example, the line width of the laser cutting line in the direction perpendicular to the extension direction of the laser cutting line may be 100 um, then the line width of the protection pattern in the direction perpendicular to the extension direction of the protection pattern may be in a range of from 120 um to 300 um. This can enable the protection pattern to effectively protect the inorganic layer in addition to ensuring that an area of the protection layer is too large. If the area of the protection layer is too large, on one hand the production cost may be increased, on the other hand, the performance of the display substrate may be adversely affected.

The protection pattern is made of metrical which can withstand the temperature of the laser. In one embodiment, the protection pattern may be made of low-temperature glass powder materials. The protection pattern may also be made of laser melting materials or laser hot-melt materials, such as polyethylene and polystyrene polycarbonate. After laser sintering, the materials of the protection pattern are melted rather than being vaporized. In this way, when cutting the display-substrate motherboard, the protection pattern at the laser cutting line is melted to cover a top surface and a lateral side of the inorganic layer. After the laser disappears, the melted protection pattern cools quickly to cover a cutting edge, thereby further enhancing the encapsulation effect.

One embodiment of the present disclosure further provides a method for manufacturing a display-substrate motherboard. The method includes: providing a base substrate; forming an inorganic layer on the base substrate; forming a plurality of spaced display components on the inorganic layer; and forming a protection pattern on the inorganic layer with the protection pattern covering a laser cutting area between adjacent display components.

In this embodiment, the protection pattern is provided on the inorganic layer of the display-substrate motherboard and covers the laser cutting area, thus, when the display-substrate motherboard is cut off by the laser to form display substrates, the protection pattern can protect the inorganic layer at the laser cutting area, thereby reducing or eliminating cracks caused by the laser cutting to the inorganic layer and then preventing outside water vapor from penetrating in along the cracks. Further, under action of heat generated by the laser, the protection pattern along a laser cutting line can be melted to cover a lateral side of the inorganic layer, thereby further enhancing the encapsulation effect, preventing outside water vapor from penetrating in, ensuring that the display substrate will not fail and improving reliability and yield of the display substrate.

The above display-substrate motherboard may be a flexible display-substrate motherboard or a rigid display-substrate motherboard. When the display-substrate motherboard is one flexible display-substrate motherboard, the base substrate may be a flexible base substrate, such as a polyimide film. When the display-substrate motherboard is one rigid display-substrate motherboard, the base substrate may be a rigid base substrate, such as a quartz substrate or a glass substrate.

In the display-substrate motherboard, the laser cutting area may be disposed around each display component in one or more circles, then the protection pattern may also be disposed around each display component in one or more circles, as long as the protection pattern can cover the laser cutting area. The protection pattern may completely cover the laser cutting area, or cover portions of the laser cutting area, as long as the protection pattern covers the laser cutting line in the laser cutting area.

The laser cutting line is formed in the laser cutting area. When cutting the display-substrate motherboard, the display-substrate motherboard is cut off along the laser cutting line. In order to enable the protection pattern to effectively protect the inorganic layer, an orthographic projection of the laser cutting line to the inorganic layer is within an orthographic projection of the protection pattern to the inorganic layer, i.e., the protection layer covers the entire of the laser cutting line in the laser cutting area.

In order to enable the protection pattern to effectively protect the inorganic layer, the size of the protection pattern is slightly greater than the size of the laser cutting line. Specifically, a line width of the protection pattern in a direction perpendicular to an extension direction of the protection pattern may be 1.1 to 3 times a line width of the laser cutting line in a direction perpendicular to an extension direction of the laser cutting line. For example, the line width of the laser cutting line in the direction perpendicular to the extension direction of the laser cutting line may be 100 um, then the line width of the protection pattern in the direction perpendicular to the extension direction of the protection pattern may be in a range of from 120 um to 300 um. This can enable the protection pattern to effectively protect the inorganic layer in addition to ensuring that an area of the protection layer is too large. If the area of the protection layer is too large, on one hand the production cost may be increased, on the other hand, the performance of the display substrate may be adversely affected.

Further, forming a protection pattern on the inorganic layer with the protection pattern covering a laser cutting area between adjacent display components includes: forming the protection pattern on the inorganic layer by means of screen printing or coating. Of course, the protection pattern may be formed in other manners. For example, materials of the protection pattern may be melt and then coated to a specified position, and then laser cutting is performed before the materials of the protection pattern are cooled down.

The protection pattern is made of metrical which can withstand the temperature of the laser. In one embodiment, the protection pattern may be made of low-temperature glass powder materials. The protection pattern may also be made of laser melting materials or laser hot-melt materials, such as polyethylene and polystyrene polycarbonate. After laser sintering, the materials of the protection pattern are melted rather than being vaporized. In this way, when cutting the display-substrate motherboard, the protection pattern at the laser cutting line is melted to cover a top surface and a lateral side of the inorganic layer. After the laser disappears, the melted protection pattern cools quickly to cover a cutting edge, thereby further enhancing the encapsulation effect.

Figure 2:
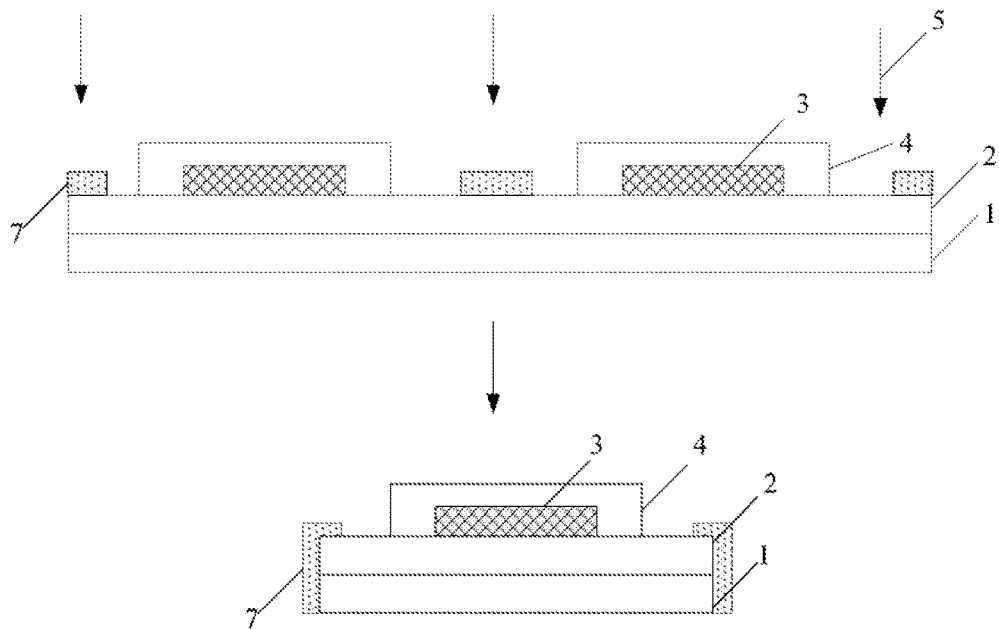
FIG. 2 is a schematic diagram showing a process of manufacturing a display substrate according to an exemplary embodiment of the present disclosure.
Figure 3:
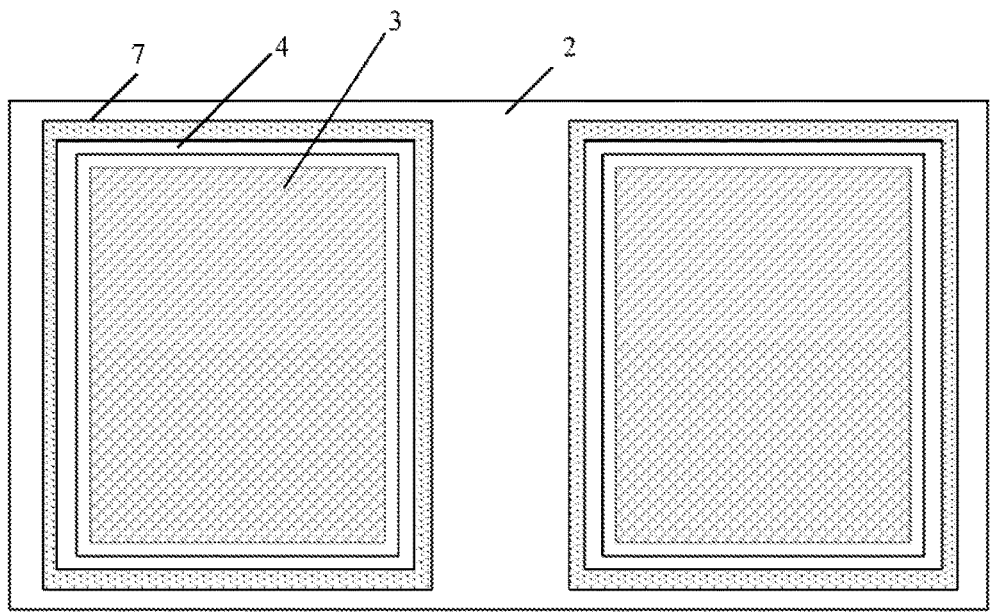
FIG. 3 is a top view of a display-substrate motherboard according to an exemplary embodiment of the present disclosure.

The technical solution of embodiments of the present disclosure will be described in detail with an example that the display-substrate motherboard is a flexible display-substrate motherboard. As shown in FIG. 2 and FIG. 3, the flexible display-substrate motherboard includes a flexible base substrate 1, an inorganic layer 2 on the flexible base substrate 1, and a plurality of display components 3 on the inorganic layer 2. The display components 3 are spaced from each other. A laser cutting area is defined between the display components 3. The laser cutting area is disposed around each display component 3. The flexible display-substrate motherboard further includes a protection pattern 7 on the inorganic layer 2. The protection pattern 7 covers the laser cutting area. In addition, the flexible display-substrate motherboard further includes a package film layer 4 covering each display component 3.

Figure 4:
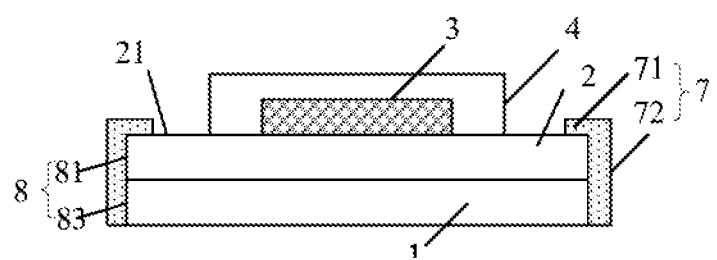
FIG. 4 is a schematic view of a display substrate according to an exemplary embodiment of the present disclosure.

As shown in FIG. 2 and FIG. 4, when manufacturing the flexible display substrate, the flexible display-substrate motherboard is cut off by the laser 5 along the laser cutting line in the laser cutting area. The presence of the protection pattern 7 on the inorganic layer 2 at the laser cutting area can protect the inorganic layer 2 under the protection pattern 7 since the protection pattern 7 covers the laser cutting area, therefore, no cracks are formed in the inorganic layer 2 due to laser cutting. Further, under action of heat generated by the laser, the protection pattern 7 along the laser cutting line can be melted to cover a lateral side 81 of the inorganic layer 2. After the laser disappears, the melted protection pattern 7 cools quickly to cover a cutting edge, i.e., an edge 8 of the flexible display substrate, thereby further enhancing the encapsulation effect, preventing outside water vapor from penetrating into the flexible display substrate, ensuring that the flexible display substrate will not fail and improving reliability and yield of the flexible display substrate.

In one embodiment shown in FIG. 4, the edge 8 of the display substrate includes a lateral side 81 of the inorganic layer 2 and a lateral side 83 of the flexible base substrate 1. The melted protection pattern 7 includes a first protection portion 71 and a second protection portion 73. The first protection portion 71 covers a top surface 21 of the inorganic layer 2, surrounds the display component 3 and is spaced from the display component 3. The second protection portion 73 covers the lateral side 81 of the inorganic layer 2 and the lateral side 83 of the flexible base substrate 1 along the periphery of the flexible display substrate.

One embodiment of the present disclosure further provides a display substrate which is formed by cutting the above display-substrate motherboard. An edge 8 of the display substrate is provided with a protection pattern 7 that covers a top surface 21 and a lateral side 81 of the inorganic layer 2.

In this embodiment, since the inorganic layer of the display substrate is protected by the protection layer, no crack is generated in the inorganic layer during the laser cutting process, thereby preventing outside water vapor from penetrating into the display substrate along the cracks. Further, the edge 8 of the display substrate is covered with the protection pattern that covers the top surface 21 and the lateral side 81 of the inorganic layer 2, thereby further enhancing the encapsulation effect, preventing outside water vapor from penetrating into the display substrate and ensuring that the display substrate will not fail.

Specifically, as shown in FIG. 4, the display substrate includes a flexible base substrate 1, an inorganic layer 2 on the flexible base substrate 1, a display component 3 on the inorganic layer 2, a package film layer 4 covering the display component 3, a first protection portion 71 and a second protection portion 73. The first protection portion 71 covers a top surface 21 of the inorganic layer 2, surrounds the display component 3 and is spaced from the display component 3. The second protection portion 73 covers the lateral side 81 of the inorganic layer 2 and the lateral side 83 of the flexible base substrate 1 along the periphery of the flexible display substrate. The first protection portion 71 and the second protection portion 73 may be made of low-temperature glass powder materials. The first protection portion 71 and the second protection portion 73 may also be made of laser melting materials or laser hot-melt materials, such as polyethylene and polystyrene polycarbonate.

One embodiment of the present disclosure further provides a method for manufacturing a display substrate. The method includes: cutting the above display-substrate motherboard with the protection pattern along a laser cutting line being melt to cover the top surface and the lateral side of the inorganic layer.

In this embodiment, when manufacturing the display substrate, since the inorganic layer is protected by the protection layer, no crack is generated in the inorganic layer during the laser cutting process, thereby preventing outside water vapor from penetrating into the display substrate along the cracks. Further, when cutting the display-substrate motherboard, the protection pattern along the laser cutting line is melt to cover the top surface and the lateral side of the inorganic layer; after the laser disappears, the melted protection pattern cools quickly to cover a cutting edge, thereby further enhancing the encapsulation effect, preventing outside water vapor from penetrating into the display substrate and ensuring that the display substrate will not fail.

One embodiment of the present disclosure further provides a display apparatus including the above display substrate. The display apparatus may be any product or component having displaying functions, such as a television, a monitor, a digital photo frame, a mobile phone, a tablet computer. The display apparatus may further include a flexible circuit board, a printed circuit board and a backplate.

Unless otherwise defined, any technical or scientific terms used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than being limited to physical or mechanical connection. Such words as "on/above", "under/below", "left" and "right" are merely used to represent relative position relationship, and when an absolute position of an object is changed, the relative position relationship will be changed too.

The above are merely the preferred embodiments of the present disclosure and shall not be used to limit the scope of the present disclosure. It should be noted that, a person skilled in the art may make improvements and modifications without departing from the principle of the present disclosure, and these improvements and modifications shall also fall within the scope of the present disclosure.

What is claimed is:

1. A display substrate comprising:
   a flexible base substrate;
   an inorganic layer on the flexible base substrate;
   a display component on the inorganic layer;
   a first protection portion; and
   a second protection portion;
   wherein the first protection portion covers a top surface of the inorganic layer, surrounds the display component and is spaced from the display component; and
   wherein the second protection portion covers a lateral side of the inorganic layer and a lateral side of the flexible base substrate along a periphery of the flexible display substrate.

2. The display substrate of claim 1, wherein the first protection portion and the second protection portion are made of low-temperature glass powder materials.

3. The display substrate of claim 1, wherein the first protection portion and the second protection portion are made of polyethylene or polystyrene polycarbonate.

4. The display substrate of claim 1, further comprising: a package film layer covering the display component; wherein the package film layer is spaced from the first protection portion.

5. A method for manufacturing a display substrate the display substrate of claim 1 comprising:
   providing a base substrate;
   forming an inorganic layer on the base substrate;
   forming a plurality of spaced display components on the inorganic layer;
   forming a protection pattern on the inorganic layer with the protection pattern covering a laser cutting area between adjacent display components; and
   using laser to cut the protection pattern along a laser cutting line to form a plurality of display substrates.

6. The method of claim 5, wherein the forming a protection pattern on the inorganic layer with the protection pattern covering a laser cutting area between adjacent display components includes:
   forming the protection pattern on the inorganic layer by means of screen printing or coating.

7. A display apparatus comprising the display substrate of claim 1.

* * * * *